Sept. 18, 1956 W. G. PFANN 2,763,731

SEMICONDUCTOR SIGNAL TRANSLATING DEVICES

Filed Feb. 9, 1952

INVENTOR
W. G. PFANN
BY [signature]
ATTORNEY

United States Patent Office 2,763,731

Patented Sept. 18, 1956

2,763,731

SEMICONDUCTOR SIGNAL TRANSLATING DEVICES

William G. Pfann, Basking Ridge, N. J., assignor to Bell Telephone Laboratories, Incorporated, New York, N. Y., a corporation of New York Application February 9, 1952, Serial No. 270,788

2 Claims. (Cl. 179—171)

Figure 1:
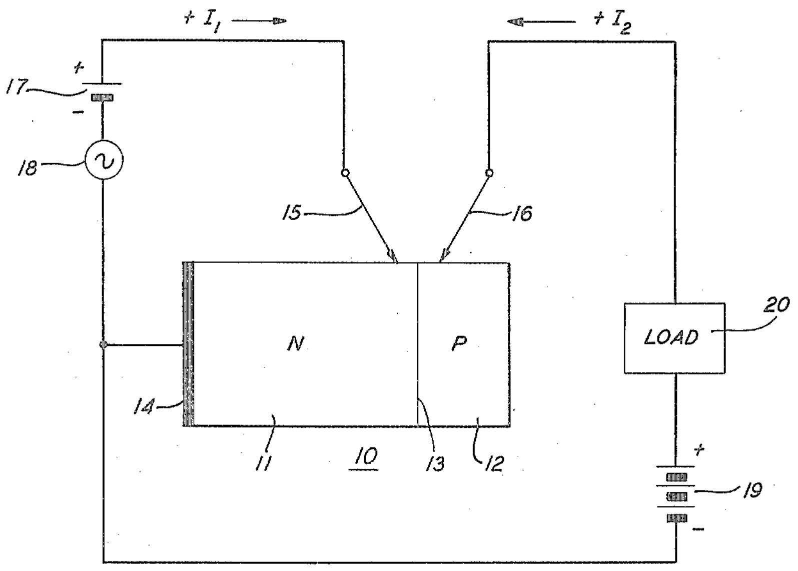

This invention relates to semiconductor signal translating devices of the class known as transistors and more particularly to such devices of the junction type.

Illustrative constructions of junction transistors are disclosed in W. Shockley Patents 2,502,488, granted April 4, 1950 and 2,569,347 granted September 25, 1951. Such devices comprise, in general, a body of semiconductive material, for example germanium or silicon, having therein contiguous zones of opposite conductivity types, that is N- and P-types, and forming a barrier or junction. They comprise also three connections to the body, termed the base, emitter and collector. In operation of the devices, electrical carriers of the sign opposite that of the carriers normally in excess in one zone are injected into that zone at the emitter, cross the barrier or junction and flow to the collector, which is biased to attract these carriers For example, positive carriers or holes may be injected into an N zone and flow to a negatively biased collector on the P zone, or negative carriers or electrons may be injected into a P zone and flow to a positively biased collector on the N zone. In either case, it will be noted, the carriers attracted to the collector are of the same sign as those injected at the emitter.

One general object of this invention is to provide a signal translating device, for example an amplifier, wherein the injection of minority carriers into a zone of a body having an NP junction therein, controls or enhances the flow across the junction and to the collector of the majority carriers in that zone.

In one illustrative embodiment of this invention, a signal translating device comprises a body of semiconductive material having therein a P zone and an N zone defining a junction, a base connection to the body, an emitter bearing against one of the zones and a collector bearing against the other zone. An input circuit is connected between the base and emitter and an output circuit is connected between the base and the collector.

In accordance with one feature of this invention, the emitter is biased to inject into the zone against which it bears carriers of the sign opposite that of the carriers normally present in excess in that zone, and the collector is biased to attract thereto carriers of the sign opposite that of the injected carriers, i. e. to attract carriers of the same sign as the majority carriers in the zone mentioned.

In N-type material, the carriers normally in excess are electrons. In P-type material, the carriers normally in excess are holes. Thus, in one specific embodiment of this invention wherein the emitter bears against the N zone and the collector against the P zone, both the emitter and collector are biased positive relative to the respective zone. The emitter, being biased in the low resistance or forward direction, injects holes into the N zone. These holes, while in the N zone, attract enough additional electrons to their vicinity to maintain electrical neutrality. Hence the electron concentration in the N region in the vicinity of the injected holes is increased. Since the emitter is close to the PN carrier, this increased electron concentration in the N region causes an increase in electron flow across the barrier whereby the electron current to the collector, which is biased positive, is enhanced. Furthermore, the field of the barrier represents a sink in the P zone for holes which are in the N region in the vicinity of the barrier and as a result holes diffuse to the barrier and cross it, entering the P region. Their presence in the P zone causes the latter to become electrically charged with the result that the barrier becomes biased in the forward direction, causing a further enhancement of electron flow across the barrier, whereby the electron current to the collector is further enhanced.

In another embodiment wherein the emitter and collector bear against the P and N zones respectively, both the emitter and collector are biased negative. Hence, electrons are injected at the emitter, these increase the flow of holes from the P to the N zone, whereby the flow of holes to the collector is enhanced.

It will be noted that, in devices constructed in accordance with this invention, control of the collector current is effected by injection into the semiconductive body of carriers of the sign opposite that of those attracted to the collector by virtue of its bias.

Figure 2:
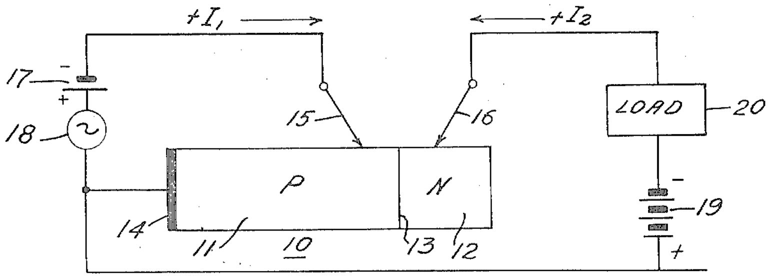

The invention and the features thereof will be understood more clearly and fully from the following detailed description with reference to the accompanying drawing in which Figs. 1 and 2 depict signal translating devices illustrative of two embodiments of this invention.

In the drawing, in the interest of clarity, the semiconductive body has been shown to a greatly enlarged scale. In a typical construction this body may be of the order of .050 inch long, .050 inch wide and .050 inch thick, with the PN junction located about .001 inch to .005 inch from one end of the body.

The signal translating device illustrated in Fig. 1 comprises a body 10 of semiconductive material, for example of germanium, having therein a zone 11 of N conductivity type and a zone 12 of P conductivity type, the two zones meeting at and defining a PN junction 13. An ohmic base connection 14, for example a metal plating, is made to the N zone 11. A pair of point contacts 15 and 16, which function as the emitter and collector respectively, bear against the zones 11 and 12 respectively, advantageously in immediate proximity to the junction 13. For example, in an illustrative construction, the point contacts 15 and 16 may be spaced substantially 0.001 inch from the junction.

The emitter 15 is biased in the forward direction, that is positive with respect to the N zone 11, by a direct-current source 17 in series with a source 18 of the signals to be translated. The collector 16 is biased in the reverse direction with respect to the zone 12 by a direct-current source 19, the collector circuit including the load 20. Amplified replicas of signals impressed by the source 18 appear across the load 20, the output voltage being 180 degrees out of phase with the signal voltage. That is to say, an increase in the emitter current indicated at $+I_1$ causes an increase in the collector current indicated at $+I_2$.

Both current and power gains are realizable. For example, in a typical device with an emitter current of 1 milliampere, collector currents of 4 milliamperes are obtained, for emitter and collector voltages of 1.8 and 5 volts respectively, with a current multiplication factor of 2.7. The current multiplication factor, commonly designated as alpha, ($\alpha$), is given by the relation $$\alpha=\left.\frac{\delta I_c}{\delta I_E}\right|_{E_c=\text{constant}}$$

where $I_C$=collector current
$I_E$=emitter current
$E_C$=collector voltage.

For an emitter current of 0.2 milliampere and a collector current of 4 milliamperes, with the emitter and collector voltages 1.58 and 11 volts respectively, a current multiplication factor of 7.8 is realized. For the same collector current and an emitter current of 0.04 milliampere and with emitter and collector voltages of .90 and 13 volts respectively, the current multiplication factor is about 18.

The operating characteristics obtained with devices in accordance with this invention are consistent with the following explanation of the physical nature of the action involved. The collector 16 is close to the junction 13 whereby its field tends to bias the junction in the forward direction. The emitter, being biased in the forward direction relative to the zone 11, injects holes into this zone. These effect enhancement of the flow of electrons across the junction from the N zone 11 to the P zone 12 and thence to the collector 16 in the manner described hereinabove.

Although in the specific embodiment illustrated in the drawing and described hereinabove the emitter bears against the N zone and the collector against the P zone, as has been indicated heretofore, the invention may be embodied also in devices wherein the emitter and collector bear against the P and N zones respectively. For this case, of course, the polarities of the sources would be the reverse of those shown in the drawing so that the emitter would inject electrons into the P zone and the collector would be biased to attract holes from the P zone. Such embodiment is depicted in Fig. 2.

It will be understood also, of course, that various modifications may be made in the specific embodiment of the invention illustrated and described without departing from the scope and spirit of this invention.

What is claimed is:

1. Signal translating apparatus comprising: a semiconductive device consisting essentially of a body of semiconductive material having therein two contiguous zones of opposite conductivity type for defining a P-N junction and only three electrode connections to the body of which the first and second are point electrodes making rectifying connections to the body on opposite sides of the junction and positioned in such close proximity to the junction that the carriers injected by the first electrode directly control the flow of carriers to the second electrode, and the third electrode makes ohmic connection to the zone to which the first electrode is connected; an input circuit connected between the first and third electrodes including a signal source and means for biasing the rectifying connection in the forward direction; and an output circuit connected between the second and third electrodes including a load and potential means for biasing said second electrode in the reverse direction at the point of contact for attracting thereto carriers of the same sign as those normally in excess in the zone to which the first electrode makes connection.

2. Signal translating apparatus comprising: a semiconductive device consisting essentially of a body of semiconductive material having therein two contiguous zones of opposite conductivity type for defining a P-N junction and only three electrode connections to the body of which the first and second are point electrodes making rectifying connection to the body on opposite sides of the junction and are each spaced substantially one mil from the junction, and the third electrode makes ohmic connection to the zone to which the first electrode is connected; an input circuit connected between the first and third electrodes including a signal source and means for biasing the rectifying connection in the forward direction; and an output circuit connected between the second and third electrodes including a load and potential means for biasing said second electrode in the reverse direction at the point of contact for attracting thereto carriers of the same sign as those normally in excess in the zone to which the first electrode makes connection.

References Cited in the file of this patent

UNITED STATES PATENTS

| | | |
|---|---|---|
| 2,561,411 | Pfann | July 24, 1951 |
| 2,570,978 | Pfann | Oct. 9, 1951 |
| 2,586,080 | Pfann | Feb. 19, 1952 |
| 2,623,103 | Kircher | Dec. 23, 1952 |

OTHER REFERENCES

"Audio Engineering," article by White, Oct. 1948, pp. 32, 33, 51, 52.